(12) United States Patent
Ishii et al.

(10) Patent No.: US 9,018,540 B2
(45) Date of Patent: Apr. 28, 2015

(54) WIRED CIRCUIT BOARD INCLUDING AN INSULATING LAYER FORMED WITH AN OPENING FILLED WITH A CONDUCTIVE PORTION AND PRODUCING METHOD THEREOF

(71) Applicant: Nitto Denko Corporation, Osaka (JP)

(72) Inventors: Jun Ishii, Osaka (JP); Saori Kanezaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 86 days.

(21) Appl. No.: 13/889,839

(22) Filed: May 8, 2013

(65) Prior Publication Data

US 2013/0319748 A1     Dec. 5, 2013

Related U.S. Application Data

(60) Provisional application No. 61/689,507, filed on Jun. 7, 2012.

(30) Foreign Application Priority Data

May 29, 2012  (JP) ................................. 2012-121550

(51) Int. Cl.
| | |
|---|---|
| H05K 1/11 | (2006.01) |
| H05K 1/02 | (2006.01) |
| H05K 3/42 | (2006.01) |
| H05K 1/05 | (2006.01) |
| H05K 3/32 | (2006.01) |

(52) U.S. Cl.
CPC ............... *H05K 1/0298* (2013.01); *H05K 3/42* (2013.01); *H05K 1/053* (2013.01); *H05K 1/111* (2013.01); *H05K 3/321* (2013.01); *H05K 2201/09745* (2013.01); *H05K 2201/10083* (2013.01)

(58) Field of Classification Search
USPC .......... 174/262, 250, 255, 256, 260, 261, 267
See application file for complete search history.

(56) References Cited

U.S. PATENT DOCUMENTS 8,634,166 B2 *  1/2014  Ohnuki et al. ............. 360/245.9
2010/0067151 A1   3/2010  Okawara et al.

FOREIGN PATENT DOCUMENTS

JP       2010086649 A    4/2010

* cited by examiner

*Primary Examiner* — Tremesha S Willis
(74) *Attorney, Agent, or Firm* — Jean C. Edwards, Esq.; Edwards Neils PLLC

(57) ABSTRACT

A wired circuit board includes an insulating layer to be formed with an opening extending therethrough in a thickness direction of the wired circuit board, a conductive layer formed on one surface of the insulating layer in the thickness direction and including a one-side terminal portion, an other-side terminal portion formed on the other surface of the insulating layer in the thickness direction, disposed so as to overlap the opening and the one-side terminal portion when projected in the thickness direction, and used to be connected to an electronic element via a conductive adhesive, and a conductive portion filling the opening to provide electrical conduction between the one-side terminal portion and the other-side terminal portion.

9 Claims, 10 Drawing Sheets

FIG.7
FIG.7(a)
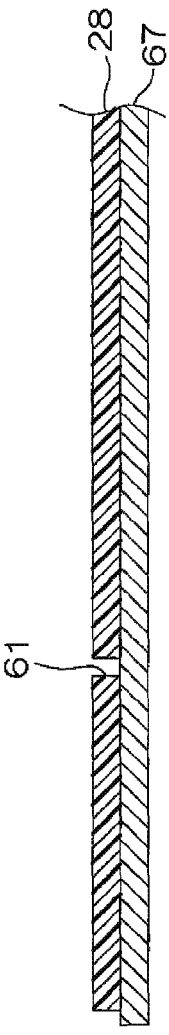
FIG.7(b)
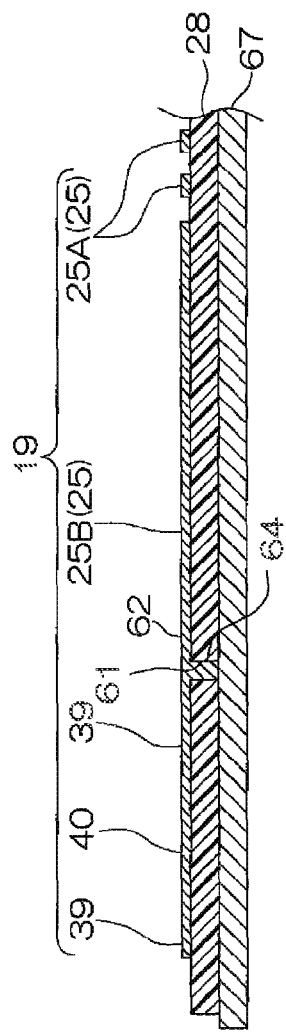
FIG.7(c)
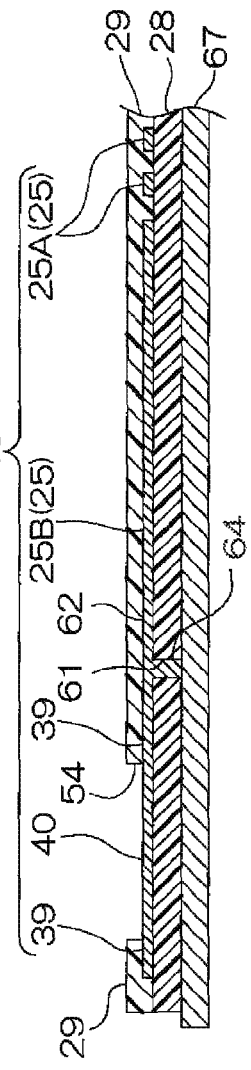
FIG.7(d)

FIG.8
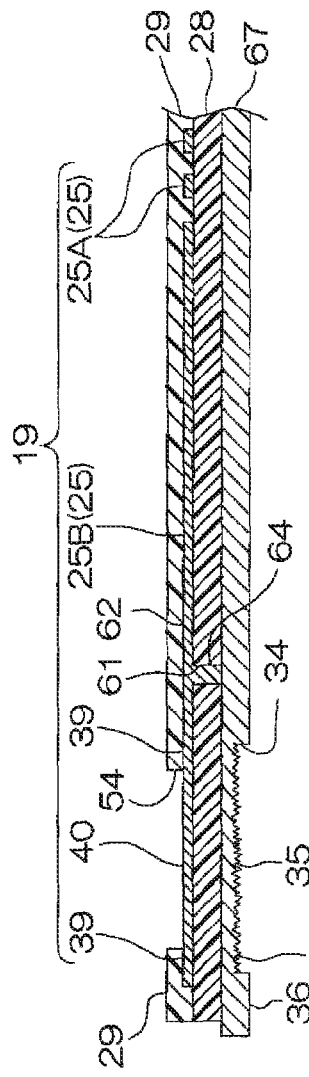
FIG.8(e)
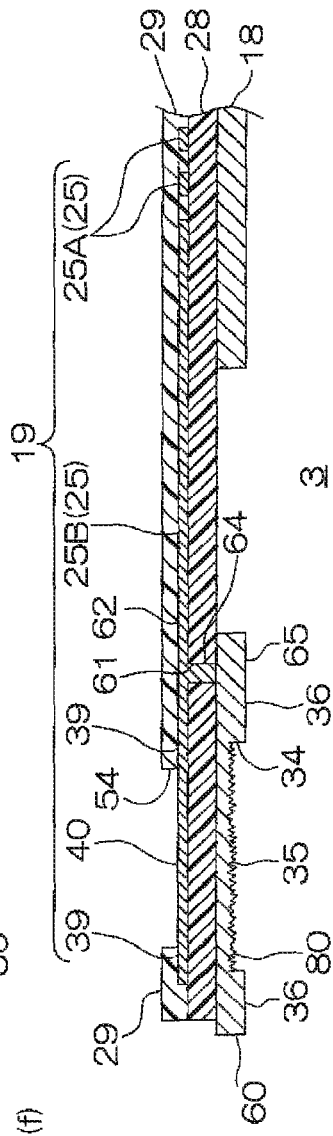
FIG.8(f)
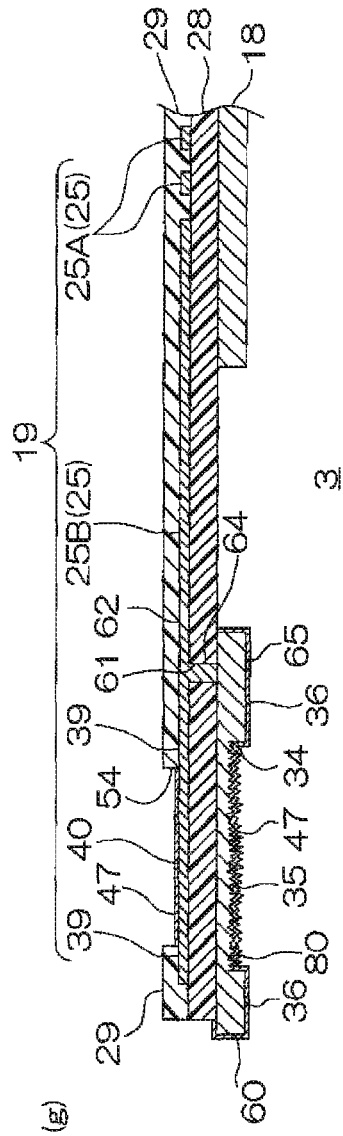
FIG.8(g)

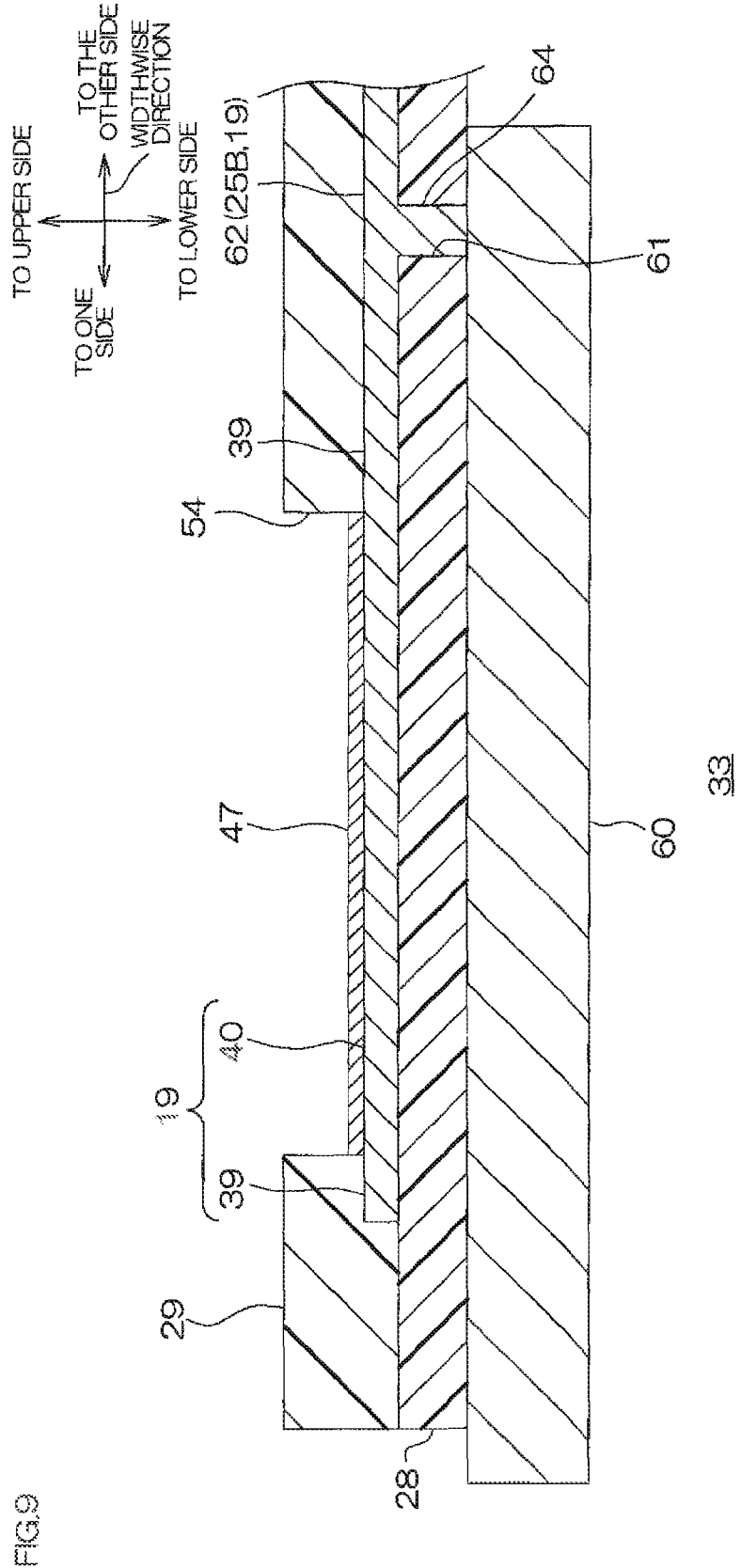

WIRED CIRCUIT BOARD INCLUDING AN INSULATING LAYER FORMED WITH AN OPENING FILLED WITH A CONDUCTIVE PORTION AND PRODUCING METHOD THEREOF

CROSS-REFERENCE TO RELATED APPLICATION

The present application claims the benefit of U.S. Provisional Application No. 61/689,507, filed on Jun. 7, 2012, and also claims priority from Japanese Patent Application No. 2012-121550 filed on May 29, 2012, the contents of which are herein incorporated by reference into this application.

BACKGROUND OF THE INVENTION

1. Field of the Invention

The present invention relates to a wired circuit board and a producing method thereof, and particularly to a wired circuit board used preferably for a suspension board with circuit mounted in a hard disk drive and a producing method thereof.

2. Description of the Related Art

A wired circuit board such as a suspension board with circuit includes a metal supporting board, an insulating base layer formed thereon, and a conductive layer formed thereon and having head-side terminals to be connected to a magnetic head. On the suspension board with circuit, the magnetic head is mounted and connected to the head-side terminals, and the suspension board with circuit is used in a hard disk drive.

In recent years, it has been proposed to mount, on such a suspension board with circuit, various electronic elements, a specific example of which is a microactuator having a piezo-element (piezoelectric element), and used to accurately and finely adjust the position and angle of a magnetic head or the like.

For example, it has been proposed that, in a connection structure between a piezoelectric actuator and a wiring member including a base material, an electrical insulating layer formed on a surface thereof and having a through hole, and a wiring portion formed on the top surface thereof, a liquid stopping member is provided around the through hole in the back surface of the electrical insulating layer, and a liquid conductive adhesive is injected into the through hole to connect the wiring portion and the electrodes of the piezoelectric actuator (see, e.g., Japanese Unexamined Patent No. 2010-86649 (see FIG. 6(C)).

In Japanese Unexamined Patent No. 2010-86649, the conductive adhesive comes in contact with each of the top surfaces of the electrodes of the piezoelectric actuator and the back surface of the wiring portion in the through hole to electrically connect the electrodes of the piezoelectric actuator to the wiring portion.

SUMMARY OF THE INVENTION

In recent years, it has been required to further improve the reliability of electrical connection between a piezoelectric actuator and a wiring portion via a conductive adhesive.

It is therefore an object of the present invention to provide a wired circuit board which allows an improvement in the reliability of electrical connection between an electronic element and a conductive layer, and a producing method thereof.

A wired circuit board of the present invention includes an insulating layer to be formed with an opening extending therethrough in a thickness direction of the wired circuit board, a conductive layer formed on one surface of the insulating layer in the thickness direction and including a one-side terminal portion, an other-side terminal portion formed on the other surface of the insulating layer in the thickness direction, disposed so as to overlap the opening and the one-side terminal portion when projected in the thickness direction, and used to be connected to an electronic element via a conductive adhesive, and a conductive portion filling the opening to provide electrical conduction between the one-side terminal portion and the other-side terminal portion.

In the wired circuit board of the present invention, it is preferable that the other-side terminal portion has asperities formed in the other surface in the thickness direction.

In the wired circuit board of the present invention, it is preferable that the asperities are formed at least in a region of the other-side terminal portion which overlaps the one-side terminal portion when projected in the thickness direction.

It is preferable that the wired circuit board of the present invention further includes a plating layer formed on the other surface of the other-side terminal portion in the thickness direction.

In the wired circuit board of the present invention, it is preferable that the electronic element is a piezoelectric element.

A method of producing a wired circuit board of the present invention includes preparing a metal supporting layer, forming an insulating layer on one surface of the metal supporting layer in a thickness direction of the wired circuit board so as to form an opening in the insulating layer extending through the insulating layer in the thickness direction, forming a conductive layer including a one-side terminal portion on one surface of the insulating layer in the thickness direction, while forming a conductive portion on an exposed surface of the metal supporting layer exposed from the opening, and etching the metal supporting layer to form an other-side terminal portion provided so as to overlap at least the one-side terminal portion and the conductive portion when projected in the thickness direction, electrically conducting with the one-side terminal portion via the conductive portion, and used to be connected to an electronic element via a conductive adhesive.

It is preferable that the method of producing a wired circuit board of the present invention further includes forming asperities in the other surface of a region of the metal supporting layer in the thickness direction which overlaps the one-side terminal portion when projected in the thickness direction.

It is preferable that the method of producing a wired circuit board of the present invention further includes forming a plating layer on the other surface of the other-side terminal portion in the thickness direction.

In the wired circuit board of the present invention, the conductive portion fills the opening to provide electrical conduction between the one-side terminal portion and the other-side terminal portion. In addition, the other-side terminal portion is disposed so as to overlap the opening and the one-side terminal portion when projected in the thickness direction.

Therefore, it is possible to electrically connect the electronic element to the other-side terminal portion via the conductive adhesive and also electrically connect the electronic element to the conductive layer and the one-side terminal portion via the other-side terminal portion and the conductive portion. It is also possible to perform surface processing on the surface of the other-side terminal portion to which the conductive adhesive adheres so as to allow the conductive adhesive to easily adhere thereto.

As a result, it is possible to improve the reliability of the electrical connection between the electronic element and each of the conductive layer and the other-side terminal portion.

The method of producing a wired circuit board of the present invention includes forming the insulating layer on the metal supporting layer so as to form the opening therein, forming the conductive layer including the one-side terminal portion on the insulating layer, while forming the conductive portion on the exposed surface of the metal supporting layer exposed from the opening, and etching the metal supporting layer to form the other-side terminal portion provided so as to overlap at least the one-side terminal portion and the conductive portion when projected in the thickness direction.

Therefore, it is possible to easily produce a wired circuit board having an improved reliability of electrical connection between the electronic element and each of the conductive layer and the one-side terminal portion.

BRIEF DESCRIPTION OF THE DRAWINGS

FIG. 7 shows a process view illustrating a producing method of the suspension board with circuit, FIG. 7(a) showing the step of preparing a metal supporting layer, FIG. 7(b) showing the step of forming an insulating base layer, FIG. 7(c) showing the step of forming a conductive layer and conductive portions, and FIG. 7(d) showing the step of forming an insulating cover layer;

FIG. 8 is a process view illustrating the producing method of the suspension board with circuit, subsequently to FIG. 7, FIG. 8(e) showing the step of forming asperities in the metal supporting layer, FIG. 8(f) showing the step of forming other-side terminal portions, and FIG. 8(g) showing the step of forming plating layers;

FIG. 9 shows an enlarged cross-sectional view of a pad portion (a form in which the entire lower surface of each of piezoelectric-element-side terminal portions is formed in a flat shape) of an assembly including a suspension board with circuit as another embodiment of the wired circuit board of the present invention.

DETAILED DESCRIPTION OF THE INVENTION

Figure 1:
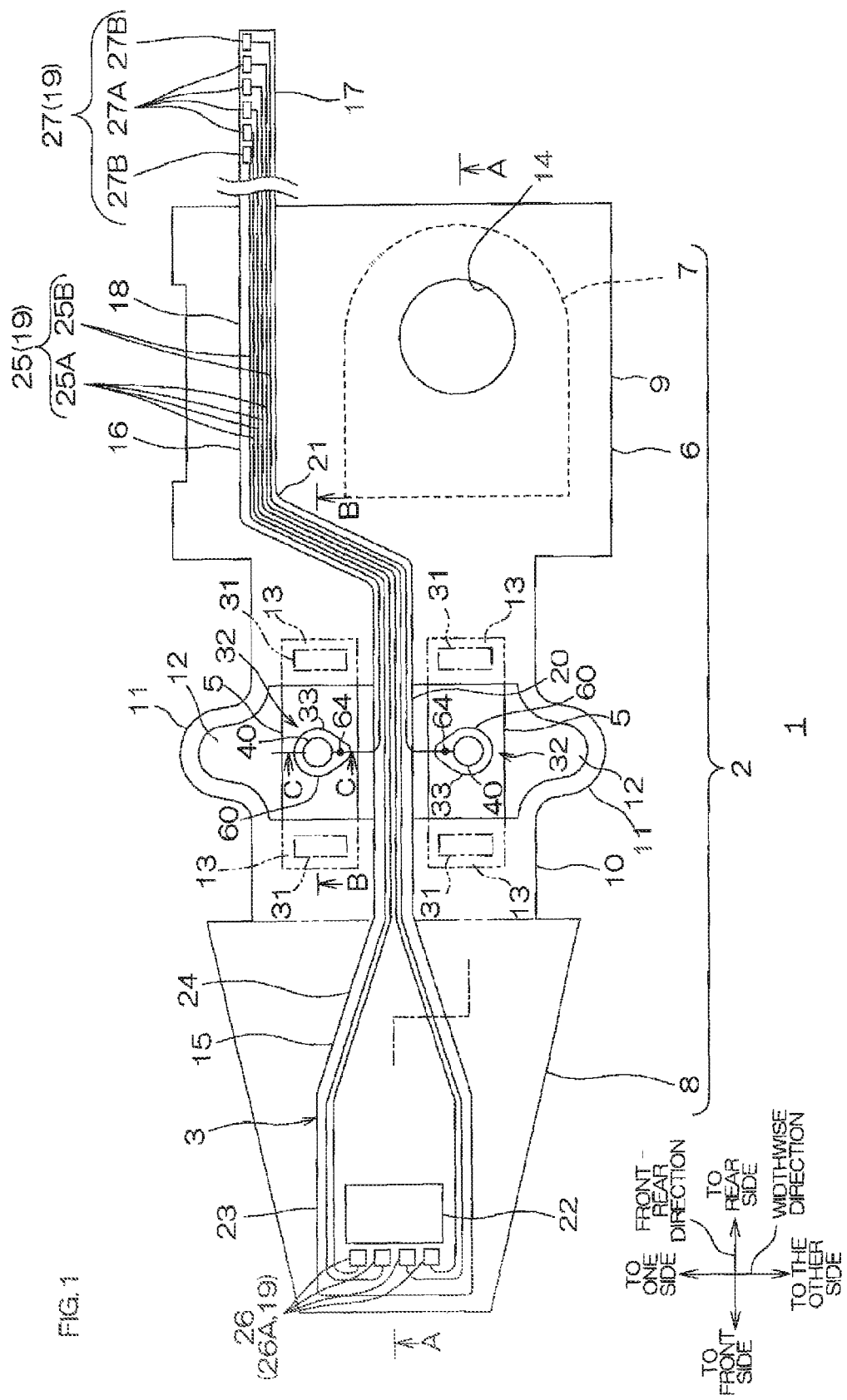
FIG. 1 shows a plan view of an assembly including a suspension board with circuit as an embodiment of the wired circuit board of the present invention.
Figure 2:
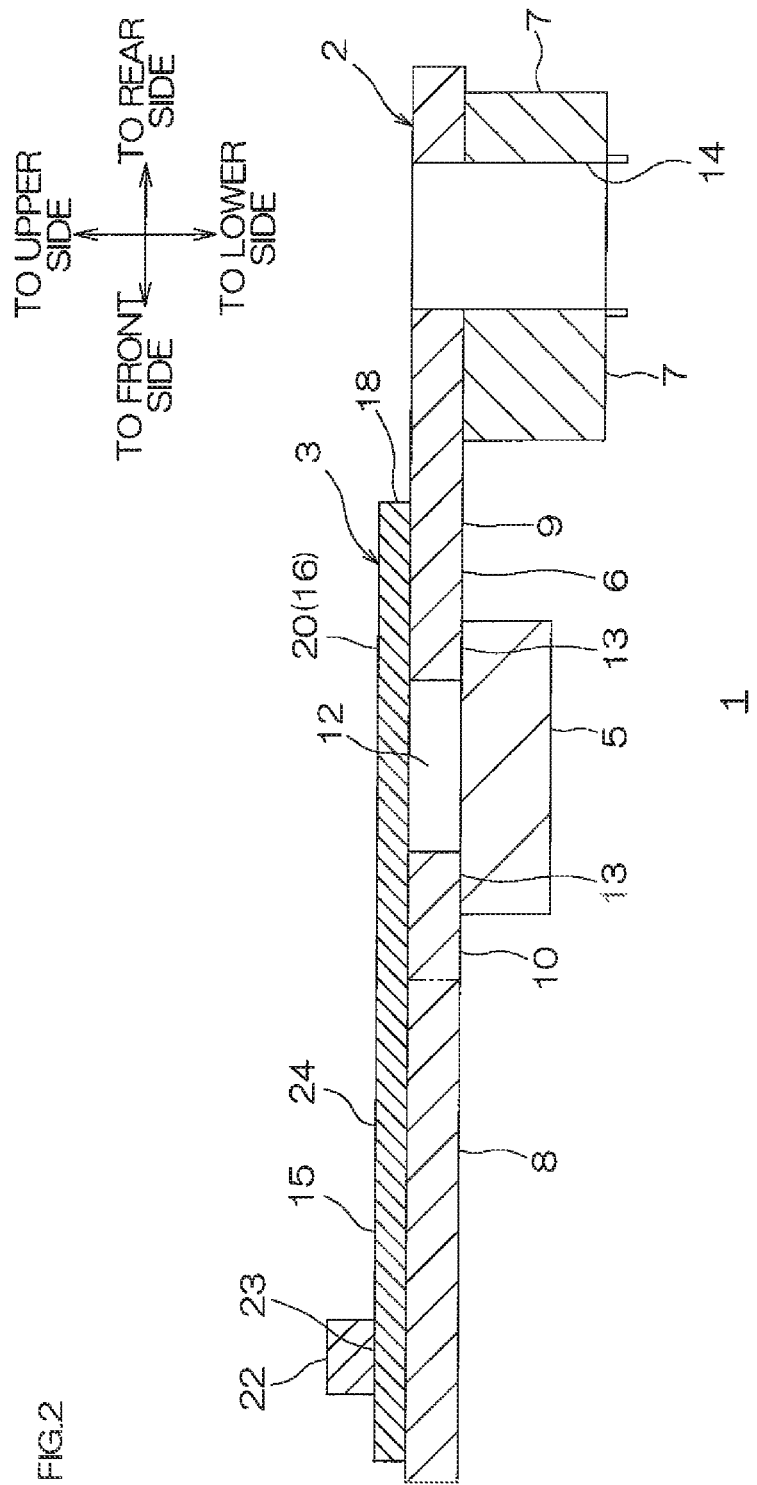
FIG. 2 shows a cross-sectional view of the assembly shown in FIG. 1 along the line A-A.
Figure 3:
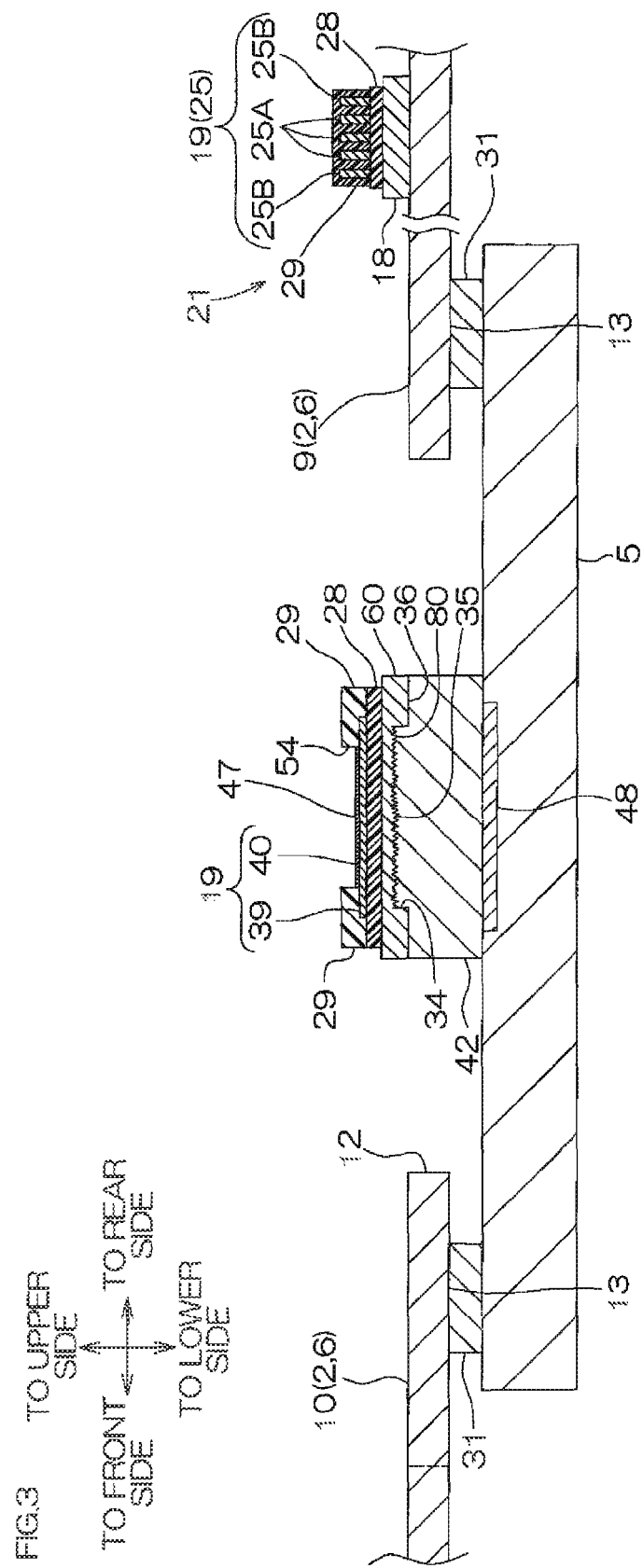
FIG. 3 shows a cross-sectional view of the assembly shown in FIG. 1 along the line B-B.
Figure 4:
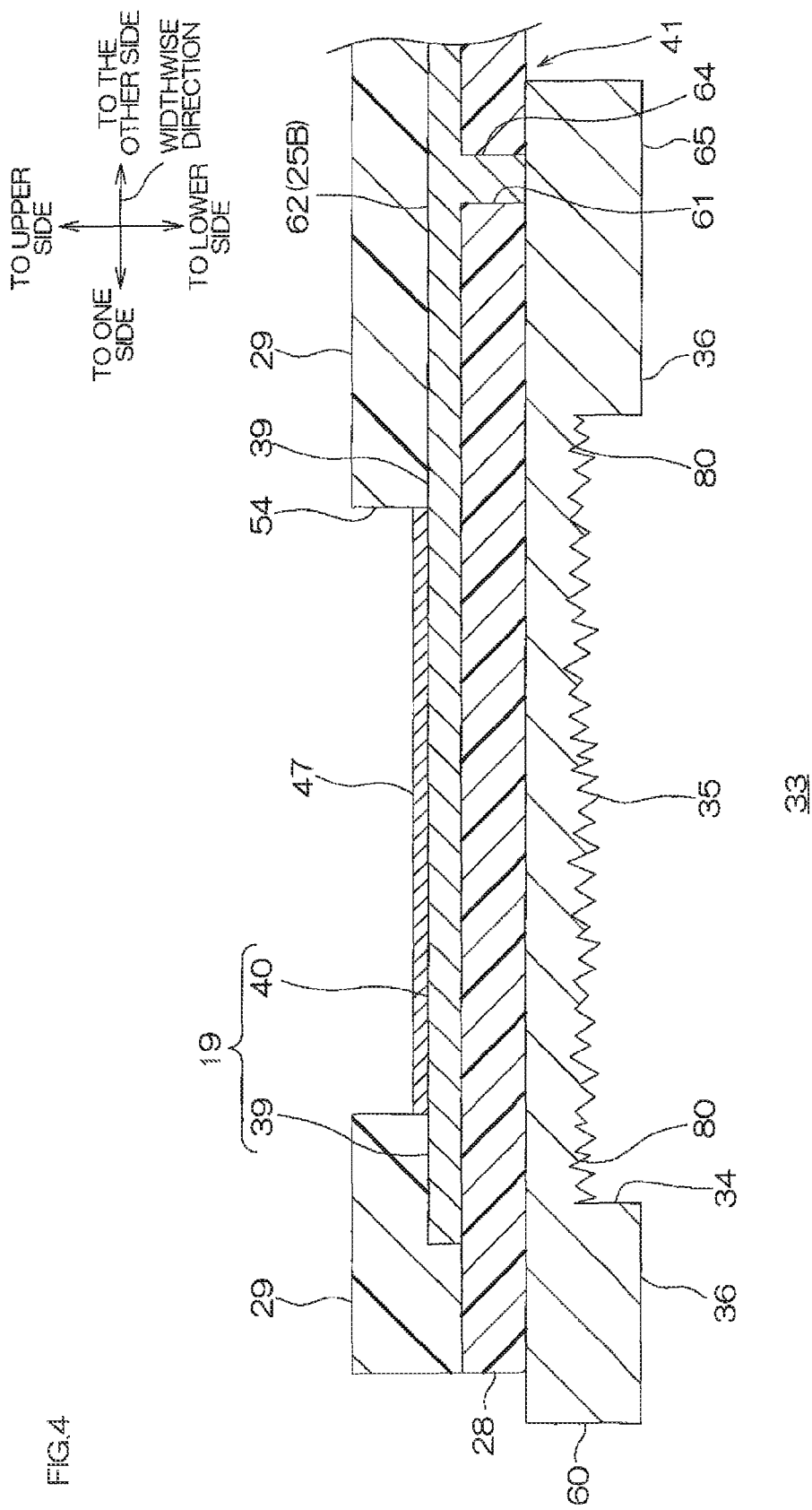
FIG. 4 shows an enlarged cross-sectional view of each of piezoelectric-element-side terminals of the assembly shown in FIG. 1 along the line C-C.
Figure 5:
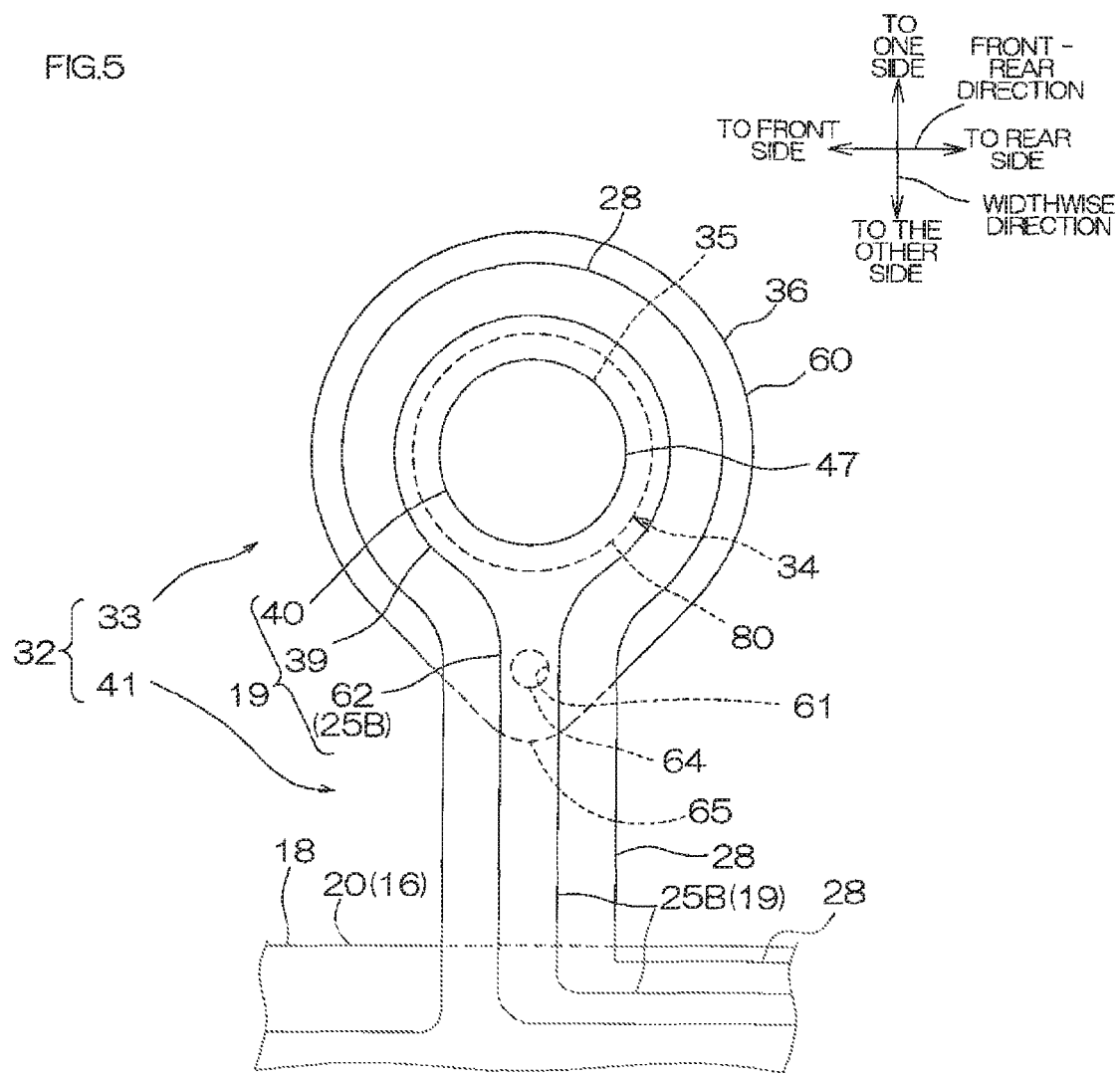
FIG. 5 shows an enlarged plan view of each of connecting arms of the assembly shown in FIG. 1.
Figure 6:
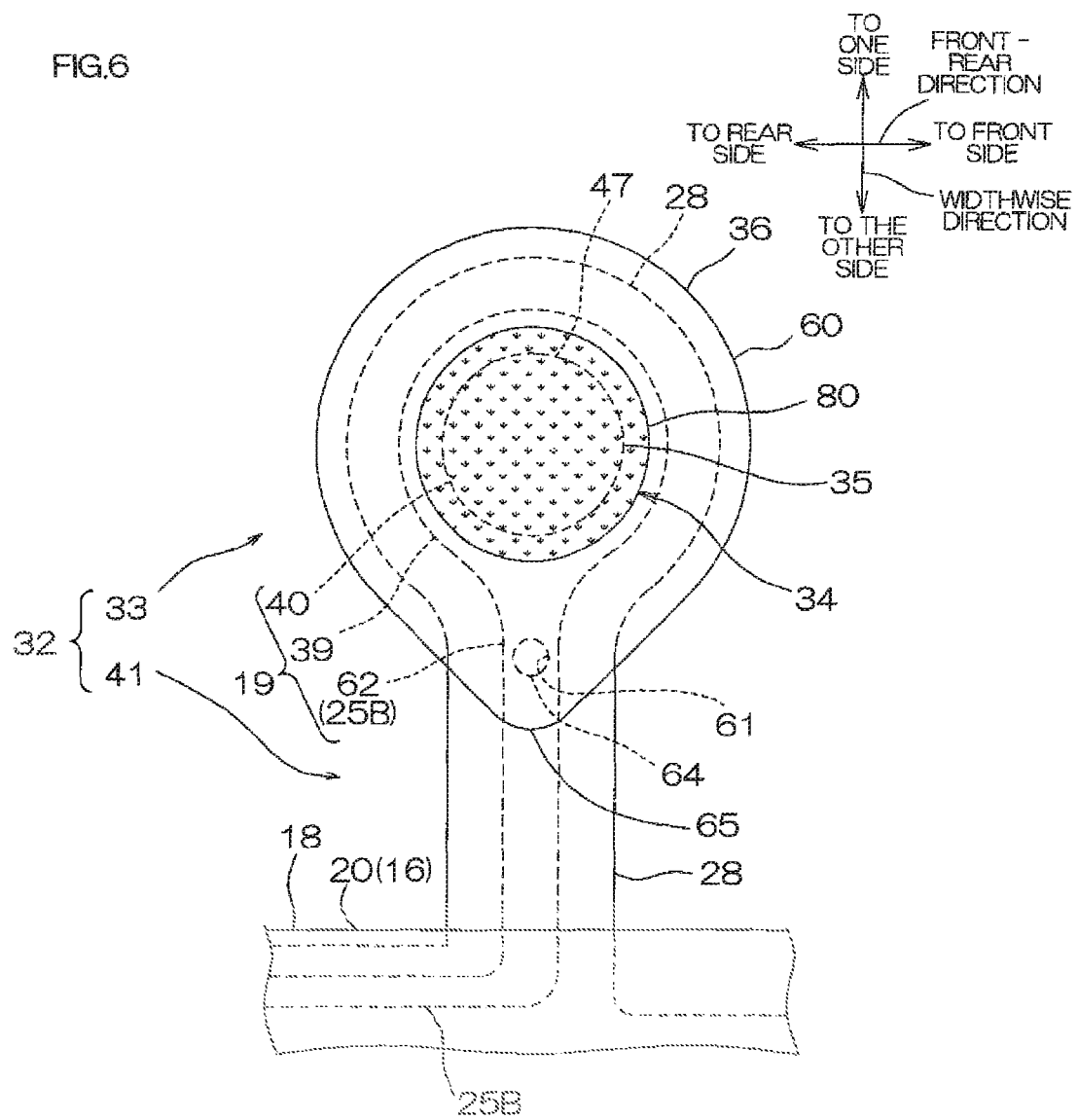
FIG. 6 shows an enlarged bottom view of the connecting arm of the assembly shown in FIG. 1.

FIG. 1 shows a plan view of an assembly including a suspension board with circuit as an embodiment of the wired circuit board of the present invention. FIG. 2 shows a cross-sectional view of the assembly shown in FIG. 1 along the line A-A. FIG. 3 shows a cross-sectional view of the assembly shown in FIG. 1 along the line B-B. FIG. 4 shows an enlarged cross-sectional view of each of piezoelectric-element-side terminals of the assembly shown in FIG. 1 along the line C-C. FIG. 5 shows an enlarged plan view of each of connecting arms of the assembly shown in FIG. 1. FIG. 6 shows an enlarged bottom view of the connecting arm of the assembly shown in FIG. 1. FIGS. 7 and 8 show process views each illustrating a producing method of the suspension board with circuit.

Note that, in FIG. 1, an insulating base layer 28 and an insulating cover layer 29 are omitted for clear illustration of relative positioning of a metal supporting board 18 and a conductive layer 19. Also, in FIG. 4, a conductive adhesive 42 described later is omitted for clear illustration of the conductive layer 19. Also, in FIG. 5, the insulating cover layer 29 is omitted for clear illustration of relative positioning of one-side terminal portions 40 and other-side terminal portions 60.

In FIGS. 1 and 2, an assembly 1 is a head-stack assembly (HSA) to be mounted in a hard disk drive (not shown). In the assembly 1, a suspension board with circuit 3 on which a slider 22 mounting a magnetic head (not shown) is mounted is supported on a support plate 2. The assembly 1 includes the support plate 2, the suspension board with circuit 3 disposed on the support plate 2 and supported on the support plate 2, and piezoelectric elements (piezo-elements) 5 as electronic elements for accurately and finely adjusting the position and angle of the suspension board with circuit 3, while being supported on the support plate 2.

The support plate 2 is formed so as to extend in a longitudinal direction (front-rear direction), and includes an actuator plate portion 6, a base plate portion 7 formed under the actuator plate portion 6, and a load beam portion 8 formed to be continued to the front side of the actuator plate portion 6.

The actuator plate portion 6 integrally includes a rear plate portion 9, a front plate portion 10 disposed on the front side of the rear plate portion 9 to be spaced apart therefrom, and flexible portions 11 formed between the rear plate portion 9 and the front plate portion 10.

The rear plate portion 9 is formed in a generally rectangular shape in plan view in the rear end portion of the actuator plate portion 6.

The front plate portion 10 is formed in a generally rectangular shape in plan view extending in a widthwise direction (direction perpendicular to the front-rear direction).

The flexible portions 11 are provided on both widthwise sides of the actuator plate portion 6. The flexible portion 11 on one widthwise side is formed so as to extend between the front end portion of the rear plate portion 9 and the rear end portion of the front plate portion 10. On the other hand, the flexible portion 11 on the other widthwise side is formed so as to extend between the front end portion of the rear plate portion 9 and the rear end portion of the front plate portion 10.

The both flexible portions 11 have respective middle portions thereof in the front-rear direction which are formed to be curved outwardly on both widthwise sides and have generally equal widths throughout the front-rear direction. Specifically, the middle portions of the flexible portions 11 in the front-rear direction are formed so as to outwardly protrude into generally U-shapes (or generally V-shapes) on both widthwise sides.

Accordingly, the flexible portions 11 are formed to be able to bring the front plate portion 10 away from and closer to the rear plate portion 9 due to the extension/contraction of the piezoelectric elements 5, as described later.

The actuator plate portion 6 is also formed with a plate opening 12 defined by the front surface of the rear plate portion 9, the rear surface of the front plate portion 10, and the widthwise inner surfaces of the flexible portions 11. The plate opening 12 extends through the actuator plate portion 6 in the thickness direction thereof.

In the front end portion of the rear plate portion 9 and the rear end portion of the front plate portion 10, two pairs of attachment regions 13 to which the rear end portions and front end portions of the piezoelectric elements 5 are respectively attached are defined. Each of the attachment regions 13 is formed in a widthwise elongated generally rectangular shape in bottom view in one widthwise end portion and in the other widthwise end portion to correspond to the front end portion of the rear plate portion 9 and the rear end portion of the front plate portion 10.

The base plate portion 7 is fixed to the middle portion of the lower surface of the rear plate portion 9 in each of the widthwise direction and the front-rear direction. The base plate portion 7 has a front portion thereof formed in a generally rectangular shape and a rear portion thereof formed in a generally semi-circular shape when viewed in plan view.

The support plate 2 is formed with a hole 14 having a generally circular shape in bottom view and extending through the middle portion of the rear plate portion 9 and the middle portion of the base plate portion 7.

Note that, to the base plate portion 7, a drive coil (not shown) for causing the front end portion of the assembly 1 to swing around the hole 14 is attached.

The load beam portion 8 is integrally formed with the actuator plate portion 6. Specifically, the load beam portion 8 is formed to extend from the front end of the front plate portion 10 toward the front side, and formed in a generally trapezoidal shape which gradually decreases in width with approach to the frontmost portion when viewed in plan view.

The support plate 2 is formed of a metal material such as, e.g., stainless steel, aluminum, iron, or an alloy thereof.

The size of the support plate 2 is set appropriately. For example, the thickness of each of the actuator plate portion 6 and the load beam portion 8 is in a range of, e.g., 30 to 150 μm, and the thickness of the base plate portion 7 is in a range of, e.g., 150 to 200 μm.

Note that the support plate 2 is provided as an integrated actuator-plate/load-beam plate integrally including the actuator plate portion 6 and the load beam portion 8.

The suspension board with circuit 3 is formed in a generally flat-belt shape in plan view extending in the front-rear direction.

As shown in FIG. 1, the suspension board with circuit 3 is provided with the metal supporting board 18 and the conductive layer 19 supported on the metal supporting board 18.

The metal supporting board 18 is formed so as to correspond to the outer shape of the suspension board with circuit 3, and integrally includes a wiring portion 16, a front portion 15 formed on the front side of the wiring portion 16, and a rear portion 17 formed on the rear side of the wiring portion 16.

The wiring portion 16 integrally includes a linear portion 20 formed in the middle portion of the metal supporting board 18 in the front-rear direction and extending in the front-rear direction, and a bent portion 21 bent to one side in the widthwise direction from the rear end portion of the linear portion 20, and then further bent rearward. Note that the linear portion 20 and the bent portion 21 are formed to have generally equal widths throughout the front-rear direction.

The wiring portion 16 supports wires 25 (described later).

The front portion 15 is formed in a generally rectangular shape in plan view continued from the front end of the linear portion 20 and slightly protruding outward on both widthwise sides from the wiring portion 16. Specifically, the front portion 15 includes a gimbal 23 on which the slider 22 (described later) is mounted, and a gimbal rear portion 24 connecting the gimbal 23 and the linear portion 20.

The gimbal 23 is formed in a generally rectangular shape in plan view having a width larger than the width of the linear portion 20. The gimbal 23 supports front-side terminals 26 (described later), while mounting the slider 22 (described later) having the magnetic head (not shown) electrically connected to the front-side terminals 26.

The gimbal rear portion 24 is formed in a generally triangular shape continued to the rear end of the gimbal 23 and gradually decreasing in width with approach to the rearmost portion. The gimbal rear portion 24 supports the wires 25.

The rear portion 17 is formed in a generally rectangular shape in plan view continued from the rear end of the bent portion 21 and having generally the same width as that of the bent portion 21. The rear portion 17 supports rear-side terminals 27 (described later).

The conductive layer 19 integrally includes the wires 25 extending along the front-rear direction, the front-side terminals 26 continued to the front end portions of the wires 25, and the rear-side terminals 27 continued to the rear end portions of the wires 25 on the metal supporting board 18.

The wires 25 include signal wires 25A each for transmitting an electric signal between the magnetic head (not shown) and a read/write board (not shown), and disposed throughout the front-rear direction of the suspension board with circuit 3. The plurality of (four) signal wires 25A are arranged in widthwise spaced-apart relation.

The wires 25 also include a plurality of (two) power-source wires 25B.

The power-source wires 25B are electrically connected to power-source-side terminals 27B described next. The power-source wires 25B are disposed to be continued to the power-source-side terminals 27B in the rear portion 17, arranged in parallel and spaced-apart relation on both sides of the signal wires 25A in the rear portion 17 and the bent portion 21, and curved outwardly on both widthwise sides in the middle portion of the linear portion 20 in the front-rear direction to reach the one-side terminal portions 40 (see FIG. 4) described later.

The front-side terminals 26 are disposed on the front portion 15. Specifically, the plurality of (four) front-side terminals 26 are arranged along the front end surface of the slider 22 in widthwise spaced-apart relation on the front side of the gimbal 23.

The front-side terminals 26 are head-side terminals 26A electrically connected to the magnetic head (not shown).

The rear-side terminals 27 are disposed on the rear end portion of the rear portion 17. Specifically, the plurality of (six) rear-side terminals 27 are arranged to be spaced apart from each other in the front-rear direction. The rear-side terminals 27 include a plurality of (four) external terminals 27A continued to the signal wires 25A, and connected to the terminals of the read/write board.

The rear-side terminals 27 also include the plurality of (two) power-source-side terminals 27B continued to the power-source wires 25B and electrically connected to the piezoelectric elements 5. Note that the power-source-side terminals 27B are disposed in spaced-apart relation on both sides of the external terminals 27A in the front-rear direction, and electrically connected to a power source (not shown).

As shown in FIGS. 3 and 4, the suspension board with circuit 3 includes the metal supporting board 18, the insulating base layer 28 formed thereon, the conductive layer 19 formed on the insulating base layer 28, and the insulating cover layer 29 formed on the insulating base layer 28 so as to cover the conductive layer 19.

The metal supporting board 18 is formed of a metal material such as, e.g., stainless steel, a 42-alloy, aluminum, a copper-beryllium alloy, or phosphor bronze. Preferably, the metal supporting board 18 is formed of stainless steel. The thickness of the metal supporting board 18 is in a range of, e.g., 15 to 25 μm, preferably 17 to 22 μm, or more preferably 18 to 20 μm.

As shown in FIG. 1, the insulating base layer 28 is formed in a pattern corresponding to the conductive layer 19 on the upper surface of the metal supporting board 18 in the front portion 15, the wiring portion 16, and the rear portion 17.

The insulating base layer 28 is formed of an insulating material such as a synthetic resin such as, e.g., a polyimide resin, a polyimide imide resin, an acrylic resin, a polyether nitrile resin, a polyether sulfone resin, a polyethylene terephthalate resin, a polyethylene naphthalate resin, or a polyvinyl chloride resin. Preferably, the insulating base layer 28 is formed of a polyimide resin.

The thickness (maximum thickness) of the insulating base layer 28 is in a range of, e.g., 4 to 15 μm, preferably 6 to 12 μm, or more preferably 8 to 10 μm.

As shown in FIGS. 1 and 3, the conductive layer 19 is formed in the foregoing pattern over the upper surface of the insulating base layer 28 in the front portion 15, the wiring portion 16, and the rear portion 17.

The conductive layer 19 is formed of a conductive material such as, e.g., copper, nickel, gold, a solder, or an alloy thereof. Preferably, the conductive layer 19 is formed of copper.

The thickness of the conductive layer 19 is in a range of, e.g., 4 to 15 μm, preferably 6 to 12 μm, or more preferably 8 to 10 μm.

The width of each of the wires 25 is in a range of, e.g., 5 to 200 μm, or preferably 8 to 100 μm. The spacing between the individual wires 25 is in a range of, e.g., 5 to 1000 μm, or preferably 8 to 100 μm.

The widths and lengths of the front-side terminals 26 and the rear-side terminals 27 are in a range of, e.g., 20 to 1000 μm, or preferably 30 to 800 μm. The spacing between the individual front-side terminals 26 and the spacing between the individual rear-side terminals 27 are in a range of, e.g., 20 to 1000 μm, or preferably 30 to 800 μm.

The insulating cover layer 29 is formed over the wiring portion 16, the front portion 15, and the rear portion 17 so as to cover the upper surface of the insulating base layer 28 around the wires 25 and the upper surfaces and side surfaces of the wires 25. The insulating cover layer 29 is also formed in a pattern exposing the front-side terminals 26 in the front portion 15 and exposing the rear-side terminals 27 in the rear portion 17, though not shown.

The insulating cover layer 29 is formed of the same insulating material as the insulating material of the insulating base layer 28. The thickness of the insulating cover layer 29 is in a range of, e.g., 2 to 7 μm, preferably 3 to 6 μm, or more preferably 4 to 5 μm.

In the suspension board with circuit 3, as shown in FIGS. 1 and 2, the lower surface of the metal supporting board 18 is supported on the support plate 2. Specifically, the lower surfaces of the wiring portion 16 and the front portion 15 are supported on the support plate 2, while the lower surface of the rear portion 17 protrudes rearward from the support plate 2 without being supported on the support plate 2.

Specifically, in the suspension board with circuit 3, the bent portion 21 is disposed in generally L-shape along the one widthwise end portion of the rear plate portion 9 and the front end portion thereof, and the linear portion 20 is disposed to extend from the widthwise middle portion of the front end portion of the rear plate portion 9, traverse the widthwise middle portion of the plate opening 12, and then reach the widthwise middle portion of the front plate portion 10. Also, in the suspension board with circuit 3, the front portion 15 is disposed to be formed on the widthwise middle portion of the load beam portion 8 to extend throughout the front-rear direction of the load beam portion 8.

The piezoelectric elements 5 are attached to the lower side of the support plate 2.

Specifically, the plurality of (two) piezoelectric elements 5 are provided in widthwise spaced-apart relation.

Each of the piezoelectric elements 5 is an actuator extendable/contractable in the front-rear direction, and is formed in a generally rectangular shape in plan view elongated in the front-rear direction. The piezoelectric element 5 is disposed so as to span the plate opening 12 in the front-rear direction.

Specifically, the both end portions of each of the piezoelectric elements 5 in the front-rear direction are bonded to the attachment regions 13 (broken lines of FIG. 1) in the front end portion of the rear plate portion 9 and in the rear end portion of the front plate portion 10 via adhesive layers 31, and fixed thereto.

As shown in FIGS. 3 and 4, in the middle portion of the upper surface of each of the piezoelectric elements 5 in the front-rear direction, an electrode 48 is provided and electrically connected to the conductive layer 19 of the suspension board with circuit 3 via the piezoelectric-element-side terminal portion 60 and a conductive portion 64, while being supported on the piezoelectric-element-side terminal portion 60 as the other-side terminal portion described next.

Each of the piezoelectric elements 5 is supplied with electricity from the conductive layer 19, and the voltage thereof is controlled to extend/contract the piezoelectric element 5.

Next, a detailed description is given to a probing terminal portion 40, the piezoelectric-element-side terminal portion 60, and the conductive portion 64 on one widthwise side of the suspension board with circuit 3 with reference to FIGS. 3 to 8. Note that the probing terminal portion 40, the piezoelectric-element-side terminal portion 60, and the conductive portion 64 on the other widthwise side are formed to be symmetrical to the probing terminal portion 40, the piezoelectric-element-side terminal portion 60, and the conductive portion 64 on the one widthwise side with respect to the linear portion 20, and therefore a description thereof is omitted.

As shown in FIGS. 5 and 6, the suspension board with circuit 3 is provided with a connecting arm 32 including the conductive layer 19, the piezoelectric-element-side terminal portion 60, and the conductive portion 64.

The connecting arm 32 is provided so as to protrude widthwise outward in an arm shape from the middle portion of the linear portion 20 in the front-rear direction thereof.

The connecting arm 32 includes a pad portion 33 disposed on one widthwise side of the linear portion 20 to be spaced apart therefrom, and a joint portion 41 coupling the pad portion 33 to the linear portion 20.

As shown in FIG. 4, the pad portion 33 includes the piezoelectric-element-side terminal portion 60, the insulating base layer 28 formed on the piezoelectric-element-side terminal portion 60, the conductive layer 19 formed on the insulating base layer 28, the insulating cover layer 29 formed on the insulating base layer 28 so as to cover a part of the conductive layer 19, and the conductive portion 64.

As shown in FIG. 6, the piezoelectric-element-side terminal portion 60 is formed in a generally drop-like shape which is like a drop falling toward the other widthwise side when viewed in bottom view. The other widthwise end portion of the piezoelectric-element-side terminal portion 60 is formed with a projecting portion 65 projecting in a generally V-shape toward to the other widthwise side.

In addition, as shown in FIGS. 4 and 6, the middle portion of the lower part of the piezoelectric-element-side terminal portion 60 is formed with a terminal recessed portion 34 which is recessed upward from a peripheral edge portion 36 of the lower part in the thickness direction.

The lower surface of the peripheral edge portion 36 is formed in a flat shape. The peripheral edge portion 36 has a generally annular shape in plan view. Specifically, the peripheral edge portion 36 is formed to have a generally circular inner shape and the same outer shape as the outer shape of the piezoelectric-element-side terminal portion 60.

The lower surface (entire surface facing downward) of the terminal recessed portion 34 includes the probing terminal portion 40 when projected in the thickness direction. Specifically, an overlapping region 35 overlapping the probing terminal portion 40 and a peripheral region 80 around the peripheral edge thereof are continuously formed. The overlapping region 35 is formed in the same shape as that of the probing terminal portion 40. The peripheral region 80 is formed in a generally annular shape in bottom view which is concentric with the probing terminal portion 40. The entire lower surface of the terminal recessed portion 34, i.e., each of the overlapping region 35 and the peripheral region 80 is formed with asperities.

The surface roughness Ra (JIS B 0601: 2001) of the lower surface of the terminal recessed portion 34 is in a range of, e.g., not less than 0.05 μm, preferably not less than 0.2 μm, or more preferably not less than 0.5 μm and, e.g., not more than 5 μm, preferably not more than 2 μm, or more preferably not more than 1 μm.

The piezoelectric-element-side terminal portion 60 is formed of the same metal material as that of the metal supporting board 18. The thickness of the piezoelectric-element-side terminal portion 60 is the same as the thickness of the metal supporting board 18 in the peripheral edge portion 36. In the part of the piezoelectric-element-side terminal portion 60 corresponding to the terminal recessed portion 34, the thickness of the piezoelectric-element-side terminal portion 60 is formed thinner than the metal supporting board 18.

In the pad portion 33, as shown in FIGS. 5 and 6, the insulating base layer 28 is formed in a generally circular shape in plan view which is concentric with the terminal recessed portion 34. As shown in FIGS. 4 to 6, the insulating base layer 28 is formed with a conduction opening 61 as an opening having a generally circular shape in plan view extending through the insulating base layer 28 in the thickness direction thereof.

The conduction opening 61 is formed on the other widthwise side of the terminal recessed portion 34 to be spaced apart therefrom. The conduction opening 61 is formed in a generally circular shape in plan view so as to be included in the projecting portion 65 of the piezoelectric-element-side terminal portion 60 when projected in the thickness direction.

In the pad portion 33, as shown in FIGS. 3 and 4, the conductive layer 19 includes the probing terminal portion 40 as the one-side terminal portion, a frame conductor 39 continued to the outer side of the probing terminal portion 40 to surround the periphery of the probing terminal portion 40, and one end portion 62 of the power-source wire 25B.

As shown in FIG. 5, the probing terminal portion 40 has a generally circular shape in plan view, is included in the terminal recessed portion 34 when projected in the thickness direction, and is formed in a circular shape concentric with the terminal recessed portion 34. The probing terminal portion 40 is also included in the insulating base layer 28 when projected in the thickness direction and disposed on one widthwise side of the conduction opening 61 to be spaced apart therefrom.

On the upper surface of the probing terminal portion 40, as shown in FIG. 4, a plating layer 47 is formed.

As shown in FIGS. 4 and 5, the frame conductor 39 is formed in a generally annular (ring) shape in plan view slightly smaller than the insulating base layer 28. The frame conductor 39 is included in the insulating base layer 28 when projected in the thickness direction to expose the upper surface of the peripheral edge portion of the insulating base layer 28. The frame conductor 39 is formed so as to include the peripheral edge of the terminal recessed portion 34 when projected in the thickness direction.

In the pad portion 3, the one end portion 62 of the power-source wire 25B is formed so as to be continued to the other end portion of the frame conductor 39. The one end portion 62 is formed so as to include the conduction opening 61 of the insulating base layer 28 when projected in the thickness direction.

In the pad portion 33, as shown in FIG. 4, the insulating cover layer 29 is formed so as to cover the frame conductor 39 and the one end portion 62 and expose the probing terminal portion 40. The insulating cover layer 29 is formed with a cover opening 54 extending therethrough in the thickness direction to expose the probing terminal portion 40. The insulating cover layer 29 is formed to have the same outer shape as the outer shape of the insulating base layer 28 when viewed in plan view. That is, the outer peripheral surface of the insulating cover layer 29 is formed flush with the outer peripheral surface of the insulating base layer 28 in the thickness direction.

As shown in FIGS. 4 and 5, in the pad portion 33, the conductive portion 64 fills the conduction opening 61 of the insulating base layer 28. Specifically, the conductive portion 64 is formed integrally with the one end portion 62 of the power-source wire 25B and, more specifically, the upper portion of the conductive portion 64 is continued to the lower surface of the one end portion 62 of the power-source wire 25B. On the other hand, the lower surface of the conductive portion 64 is in contact with the upper surface of the projecting portion 65 of the piezoelectric-element-side terminal portion 60.

Thus, the conductive portion 64 electrically connects the power-source wire 25B and the probing terminal portion 40 to the piezoelectric-element-side terminal portion 60 (provides conduction therebetween).

The dimensions of the pad portion 33 are selectively determined appropriately. The maximum length of the piezoelectric-element-side terminal portion 60 is in a range of, e.g., 100 to 1000 μm. The diameter (maximum length) of the terminal recessed portion 34 (i.e., the overlapping region 35 and the peripheral region 80) of the piezoelectric-element-side terminal portion 60 is in a range of, e.g., 50 to 500 μm, preferably 150 to 400 μm, or more preferably 200 to 300 μm. The width of the peripheral edge portion 36 is in a range of, e.g., 30 to 200 μm, preferably 50 to 150 μm, or more preferably 80 to 120 μm. The diameter (maximum length) of the insulating base layer 28 is in a range of, e.g., 100 to 1000 μm.

The widthwise distance (shortest distance) between the conduction opening 61 of the insulating base layer 28 and the cover opening 54 is in a range of, e.g., 30 to 100 μm, preferably 40 to 80 μm, or more preferably 50 to 70 μm. The widthwise distance (shortest distance) between the conduction opening 61 of the insulating base layer 28 and the terminal recessed portion 34 of the piezoelectric-element-side terminal portion 60 is in a range of, e.g., 0 to 100 µm, preferably 10 to 80 µm, or more preferably 20 to 50 µm. The diameter (maximum length) of the conduction opening 61 is in a range of, e.g., 20 to 100 µm, preferably 30 to 90 µm, or more preferably 50 to 70 µm.

The outer diameter (maximum length) of the frame conductor 39 of the conductive layer 19 is in a range of, e.g., 90 to 990 µm. The diameter (maximum length) of the probing terminal portion 40 of the conductive layer 19 is in a range of, e.g., 40 to 480 µm, preferably 100 to 300 µm, or more preferably 180 to 220 µm.

As shown in FIG. 4, the thickness of the piezoelectric-element-side terminal portion 60 is the same as the thickness of the metal supporting board 18 in the peripheral edge portion 36. The thickness of the part of the piezoelectric-element-side terminal portion 60 corresponding to the terminal recessed portion 34 is in a range of, e.g., not more than 90%, preferably not more than 70%, or more preferably not more than 50% and also, e.g., not less than 20% of the thickness of the peripheral edge portion 36. Specifically, the thickness of the part of the piezoelectric-element-side terminal portion 60 corresponding to the terminal recessed portion 34 is in a range of, e.g., 3 to 20 µm, preferably 3 to 15 µm, or more preferably 3 to 10 µm.

The thicknesses of the insulating base layer 28, the insulating cover layer 29, and the conductive layer 19 in the pad portion 33 are the same as the thicknesses of the insulating base layer 28, the insulating cover layer 29, and the conductive layer 19 in the linear portion 20. In particular, the minimum thickness of the insulating cover layer 29 in the pad portion 33, specifically the distance from the upper surface of the frame conductor 39 to the upper surface of the insulating cover layer 28 is in a range of, e.g., 2 to 7 µm, preferably 3 to 6 µm, or more preferably 4 to 5 µm. The maximum thickness of the insulating cover layer 29, specifically the distance from the upper surface of the insulating base layer 28 to the upper surface of the insulating cover layer 29 is in a range of, e.g., 6 to 22 µm, preferably 9 to 18 µm, or more preferably 12 to 15 µm.

As shown in FIGS. 5 and 6, the joint portion 41 extends between one widthwise end portion of the middle portion of the linear portion 20 in the front-rear direction and the other widthwise end portion of the pad portion 33.

The joint portion 41 is formed in a generally rectangular shape in plan view extending in the widthwise direction and having a width smaller than the outer diameter (length in the front-rear direction shorter than that) of the pad portion 33.

As shown in FIG. 5, the joint portion 41 includes the insulating base layer 28, the power-source wire 25B formed on the insulating base layer 28, and the insulating cover layer 29 (omitted in FIG. 5 and shown in FIG. 4) formed so as to cover the power-source wire 25B.

In the joint portion 41, the insulating base layer 28 is formed in a shape corresponding to the outer shape of the joint portion 41. The insulating base layer 28 in the joint portion 41 is formed to be continued to the insulating base layer 28 in the linear portion 20 and to the insulating base layer 28 in the pad portion 33.

The power-source wire 25B in the joint portion 41 is formed so as to extend along the widthwise direction, and formed to be continued to the power-source wire 25B in the linear portion 20 and to the one end portion 62 in the pad portion 33.

In the joint portion 41, as shown in FIG. 4, the insulating cover layer 29 is formed so as to cover the upper surface and side surfaces of the power-source wire 25B.

Also, in the suspension board with circuit 3, as shown in FIGS. 3 and 5, the plating layers 47 are formed on the respective surfaces of the individual terminals, which are specifically the front-side terminals 26 (see FIG. 1), the rear-side terminals 27 (see FIG. 1), and the probing terminal portion 40.

The plating layer 47 is formed of a metal material such as, e.g., nickel or gold. Preferably, the plating layer 47 is formed of gold. The thickness of the plating layer 47 is in a range of, e.g., 0.3 to 2 µm, preferably 0.5 to 1.5 µm, or more preferably 0.8 to 1.2 µm.

Next, a producing method of the assembly 1 is described.

To produce the assembly 1, each of the suspension board with circuit 3, the support plate 2, and the piezoelectric elements 5 is prepared first.

Next, a method of preparing (producing) the suspension board with circuit 3 is described with reference to FIGS. 7 and 8.

In the method, as shown in FIG. 7(a), a metal supporting layer 67 is prepared first.

The metal supporting layer 67 is a layer for forming the metal supporting board 18 and the piezoelectric-element-side terminal portions 60. The material and thickness of the metal supporting layer 67 are the same as those of the metal supporting board 18 and the piezoelectric-element-side terminal portions 60 shown above.

Next, as shown in FIG. 7(b), the insulating base layer 28 is formed on the metal supporting layer 67.

Specifically, the insulating base layer 28 is formed on the metal supporting layer 67 into a pattern formed with the conduction openings 61.

To form the insulating base layer 28, e.g., a varnish of a photosensitive insulating material is applied first to the upper surface of the metal supporting layer 67 and dried to form a photosensitive base coating.

Next, the photosensitive base coating is subjected to exposure via a photomask not shown. The photomask includes light shielding portions and a light transmitting portion in a pattern. The light transmitting portion is caused to face the portion of the base coating in which the insulating base layer 28 is formed, and the light shielding portions are caused to face the portions of the base coating in which the conduction openings 61 are formed.

Thereafter, the base coating subjected to the exposure is developed, and cured by heating as necessary to form the insulating base layer 28 into the foregoing pattern formed with the conduction openings 61.

Next, as shown in FIG. 7(c), the conductive layer 19 is formed over the upper surface of the insulating base layer 28. At the same time, the conductive portions 64 are formed over the upper surface of the metal supporting layer 67 exposed from the conduction openings 61.

That is, as shown in FIG. 1, the conductive layer 19 is formed in a pattern including the wires 25, and the front-side terminals 26, the rear-side terminals 27, the frame conductors 39, and the probing terminal portions 40 each continued thereto, while the conduction openings 61 are filled with the conductive portions 64.

The conductive layer 19 and the conductive portions 64 are simultaneously formed by an additive method, a subtractive method, or the like.

Next, as shown in FIG. 7(d), the insulating cover layer 29 is formed over the conductive layer 19 and the insulating base layer 28.

Specifically, the insulating cover layer 29 is formed into a pattern formed with the cover openings 54 over the conductive layer 19 and the insulating base layer 28. A method of forming the insulating cover layer 29 is the same as the method of forming the insulating base layer 28.

Next, as shown in FIG. 8(e), the lower surface of the metal supporting layer 67 is formed with asperities. More specifically, the asperities are formed in a region overlapping at least the probing terminal portions 40 when the insulating base layer 28 is projected in the thickness direction.

As a method of forming the asperities, there can be used, e.g., half etching, laser processing, a physical formation method which pokes at the lower surface of the metal supporting layer 67 with a needle, or the like. Preferably, the asperities are formed by half etching performed under the conditions including a reduced etching time corresponding to 1/10 to 1/2 of a normal etching time. Specifically, on the lower surface of the metal supporting layer 67, an etching resist is laminated so as to expose the overlapping regions 35 and the peripheral regions 80, and the exposed lower surface of the metal supporting layer 67 is etched to be formed with the asperities. In this manner, the terminal recessed portions 34 corresponding to the overlapping regions 25 and the peripheral regions 80 are formed as portions thinner than the peripheral edge portions 36.

Next, as shown in FIG. 8(e), the metal supporting layer 67 is trimmed to form the metal supporting board 18 and the piezoelectric-element-side terminal portions 60 in the foregoing pattern.

Specifically, the metal supporting layer 67 is formed into the pattern of the metal supporting board 18 and the piezoelectric-element-side terminal portions 60 by, e.g., etching such as dry etching (e.g., plasma etching) or wet etching (e.g., chemical etching), drilling perforation, laser processing, or the like. Preferably, the metal supporting layer 67 is trimmed by wet etching.

Thereafter, as shown in FIG. 8(g), the plating layer 47 is formed on the surface of each of the front-side terminals 26 (see FIG. 1), the rear-side terminals 27 (see FIG. 1), the probing terminal portions 40, and the piezoelectric-element-side terminal portions 60 by plating such as, e.g., electroless plating or electrolytic plating, or preferably by electrolytic plating.

In this manner, the suspension board with circuit 3 is prepared (produced).

Thereafter, in the obtained suspension board with circuit 3, the front end (lower end) of a test probe is pressed against each of the probing terminal portions 40 to examine electrical conduction in the conductive layer 19.

Next, as shown in FIGS. 1 to 3, the prepared suspension board with circuit 3, the support plate 2, and the piezoelectric elements 5 are assembled.

Specifically, the suspension board with circuit 3 is disposed on the upper surface of the support plate 2. That is, as shown in FIG. 1, the suspension board with circuit 3 is fixed to the support plate 2 by means of, e.g., welding, an adhesive, or the like such that the linear portion 20 of the wiring portion 16 traverses the widthwise middle portion of the plate opening 12, the bent portion 21 thereof is disposed on the one widthwise end portion and front end portion of the rear plate portion 9, and the front portion 15 is disposed on the widthwise middle portion of the load beam portion 8 throughout the front-rear direction of the load beam portion 8. In addition, the suspension board with circuit 3 is fixed to the support plate 2 such that the connecting arms 32 are disposed in the both widthwise end portions of the plate opening 12.

Thereafter, as shown in FIG. 3, each of the piezoelectric elements 5 is fixed to the support plate 2, while the electrode 48 of the piezoelectric element 5 is electrically connected to the piezoelectric-element-side terminal portion 60.

To fix the piezoelectric element 5 to the support plate 2, the adhesive layers 31 are disposed on the attachment regions 13 of the actuator plate portion 6 and, via the adhesive layers 31, the both end portions of the piezoelectric element 5 in the front-rear direction are attached to the attachment regions 13. As shown in FIG. 1, the piezoelectric elements 5 are disposed in the plate opening 12 and on the both widthwise outsides of the linear portion 20 of the suspension board with circuit 3 to be spaced apart therefrom.

Also, to electrically connect the electrode 48 of the piezoelectric element 5 to the piezoelectric-element-side terminal portion 60, as shown in FIG. 3, the conductive adhesive 42 is provided between the electrode 48 and the piezoelectric-element-side terminal portion 60 so as to come in contact at least with the terminal recessed portion 34.

The conductive adhesive 42 is, e.g., a connection medium (a conductive paste such as, e.g., a gold paste or silver paste or a low-melting-point metal such as an eutectic alloy (tin-based alloy) such as, e.g., a tin-bismuth alloy or a tin-indium alloy, preferably the conductive paste) which exhibits an adhesive effect when heated at a relatively low temperature (in a range of, e.g., 100 to 200° C.).

The amount of the conductive adhesive 42 is set to allow the conductive adhesive 42 to fill the terminal recessed portions 34, overflow from the terminal recessed portions 34, and cover at least the lower surfaces of the piezoelectric-element-side terminal portions 60. That is, the amount of the conductive adhesive 42 is set larger than the total volume of the terminal recessed portions 34. The amount of the conductive adhesive 42 is set to a value in a range of, e.g., 110 to 1000%, or preferably 300 to 800% of, e.g., the total volume of the terminal recessed portions 34. In this manner, the conductive adhesive 42 fills the terminal recessed portions 34 to come in contact therewith, while coming in contact with the lower surfaces of the peripheral edge portions 36 and also with the electrodes 48 of the piezoelectric elements 5.

Thus, the electrodes 48 are electrically connected to the piezoelectric-element-side terminal portion 60.

Thereafter, the tip of the test probe is pressed against each of the probing terminal portions 40 to examine electrical conduction between the electrode 48 and the piezoelectric-element-side terminal portion 60.

In addition, as shown in FIGS. 1 and 2, the slider 22 mounting the magnetic head (not shown) is mounted on the gimbal 23 to electrically connect the magnetic head (not shown) and the front-side terminals 26.

Moreover, the read/write board (not shown) is electrically connected to the external terminals 27A, and the power source (not shown) is electrically connected to the power-source-side terminals 27B.

Furthermore, the drive coil (not shown) is attached to the base plate portion 7.

In this manner, the assembly 1 is obtained. The assembly 1 is mounted in the hard disk drive (not shown).

In the hard disk drive, the slider 22 of the assembly 1 circumferentially travels relative to a rotating hard disk in the form of a circular plate, while being floated over the surface of the hard disk with a minute gap being held therebetween. Meanwhile, the magnetic head (not shown) of the assembly 1 reads/writes information, while moving in the radial direction of the hard disk based on driving by the drive coil.

In addition, by the extension/contraction of the piezoelectric elements 5, the position of the magnetic head relative to the hard disk drive is accurately and finely adjusted.

That is, electricity is supplied from the power source (not shown) to one of the piezoelectric elements 5 via the power-source-side terminal 27B, the power-source wire 25B, the conductive portion 64, and the piezoelectric-element-side terminal portion 60 and the voltage thereof is controlled so that the piezoelectric element 5 contracts. As a result, the front end portion of the rear plate portion 9 and the rear end portion of the front plate portion 10 in one widthwise end portion come closer to each other, while being flexibly supported on the flexible portion 11.

At the same time, electricity is supplied from the power source (not shown) to the other piezoelectric element 5 via the power-source-side terminal 27B, the power-source wire 25B, the conductive portion 64, and the piezoelectric-element-side terminal portion 60 and the voltage thereof is controlled so that the piezoelectric element 5 extends. As a result, the front end portion of the rear plate portion 9 and the rear end portion of the front plate portion 10 in the other widthwise end portion go farther away from each other, while being flexibly supported on the flexible portion 11.

Consequently, the front plate portion 10 and the load beam portion 8 swing around the widthwise middle point of the front end portion of the rear plate portion 9 toward one widthwise side. At the same time, the suspension board with circuit 3 and the slider 22 which are fixed to the load beam portion 8 swing toward one widthwise side.

On the other hand, when one of the piezoelectric elements 5 is extended and the other piezoelectric element 5 is contracted, the front plate portion 10 and the load beam portion 8 swing in a direction opposite to the direction described above.

In the suspension board with circuit 3, it is possible to electrically connect the electrodes 48 of the piezoelectric element 5 to the power-source wires 25B via the conductive adhesive 42, the piezoelectric-element-side terminal portions 60, and the conductive portions 64 and also electrically connect the electrodes 48 of the piezoelectric elements 5 to the probing terminal portions 40 via the conductive adhesive 42, the piezoelectric-element-side terminal portions 60, and the conductive portions 64. On the other hand, the piezoelectric-element-side terminal portions 60 are exposed downward so that the surface processing thereof is easy. This allows the contact area between the conductive adhesive 42 and each of the piezoelectric-element-side terminal portions 60 to be easily increased. Therefore, it is possible to improve the reliability of the connection between the piezoelectric elements 5 and the conductive layer 19 and the probing terminal portions 40.

In the embodiment of FIG. 4, the asperities are formed in the overlapping regions 35 and the peripheral regions 80. However, it is also possible to, e.g., form the asperities only in the overlapping regions 35, though not shown. In the two embodiments described above, the asperities are formed at least in the overlapping regions 35 and, by the anchoring effect due to the asperities, the overlapping regions 35 and the heat conductive adhesive 42 are solidly bonded to each other. As a result, even when the test probe is downwardly brought into contact with the probing terminal portion 40 of each of the pad portions 33 to examine electrical conduction between the electrode 48 and the piezoelectric-element-side terminal portion 60, the probing terminal portion 40 is reliably connected to and supported on the piezoelectric element 5 via the heat conductive adhesive 42. Therefore, it is possible to inhibit the displacement of the probing terminal 40.

Also, in the embodiment of FIG. 4, on the surface of each of the probing terminal portions 40, the plating layer 47 is formed. However, as shown in FIG. 8(f), it is also possible to, e.g., expose the surface of the probing terminal portion 40 without forming the plating layer 47. In the embodiment, by, e.g., omitting the step of performing plating in FIG. 8(g) with reference to the production process view of FIG. 8, the suspension board with circuit 3 of FIG. 8(f) can be produced. Preferably, in the same manner as in the embodiment of FIG. 4, the plating layer 47 is formed on the surface of the probing terminal portion 40. According to the embodiment, since the plating layer 47 is formed, the probing terminal portion 40 can be protected.

In accordance with the producing method of the suspension board with circuit 3 shown in FIGS. 7 and 8, the insulating base layer 28 is formed on the upper surface of the metal supporting layer 67 so as to form the conduction openings 61, and the conductive layer 19 including the probing terminal portions 40 is formed on the upper surface of the insulating base layer 28, while the conductive portions 64 are formed on the exposed surfaces of the metal supporting layer 67 exposed from the conduction openings 61, and the metal supporting layer 67 is etched to form the piezoelectric-element-side terminal portions 60.

As a result, it is possible to easily produce the suspension board with circuit 3 having an improved reliability of electrical connection between the piezoelectric elements 5 and the conductive layer 19 and the probing terminal portions 40.

Also, in accordance with the producing method of the suspension board with circuit 3, as shown in FIG. 8(e), the asperities are formed in each of the overlapping regions 35 of the metal supporting layer 67.

The formation of the asperities can be easily performed by half etching. Therefore, by half-etching the metal supporting layer 67 to form the asperities and subsequently forming the piezoelectric-element-side terminal portions 60, it is possible to continuously and smoothly perform the formation of the asperities and the formation of the piezoelectric-element-side terminal portions 60 and substantially reduce the steps.

Note that, in the embodiment of FIG. 4, the terminal recessed portions 34 are formed in the center portions of the lower surfaces of the piezoelectric-element-side terminal portions 60 and the asperities are formed in the lower surfaces of the terminal recessed portions 34. However, as shown in, e.g., the embodiment of FIG. 9, the lower surfaces of the piezoelectric-element-side terminal portions 60 can also be formed in flat shapes in which neither the terminal recessed portions 40 nor the asperities are provided. The embodiment of FIG. 9 can be produced, by, e.g., omitting the step of forming the asperities in FIG. 8(e) with reference to the production process view of FIG. 8.

Preferably, in the same manner as in the embodiment of FIG. 4, the asperities are formed in the lower surfaces of the terminal recessed portions 34. Since the asperities are formed in the terminal recessed portions 34 as the regions of the piezoelectric-element-side terminal portions 60 in contact with the conductive adhesive 42, the contact areas between the piezoelectric-element-side terminal portions 60 and the conductive adhesive 42 can be reliably increased. In addition, by the anchoring effect due to the asperities, the piezoelectric-element-side terminal portions 60 and the conductive adhesive 42 can be solidly bonded to each other. As a result, it is possible to further improve the reliability of the connection between the piezoelectric elements 5 and the conductive layer 19 and the probing terminal portions 40.

In the embodiment of FIG. 4, the terminal recessed portion 34 is formed in the center portion of the lower surface of each of the piezoelectric-element-side terminal portions 60. However, it is also possible to, e.g., form the lower surface of the terminal recessed portion 34 in a flat shape in which the asperities are not formed.

Figure 10:
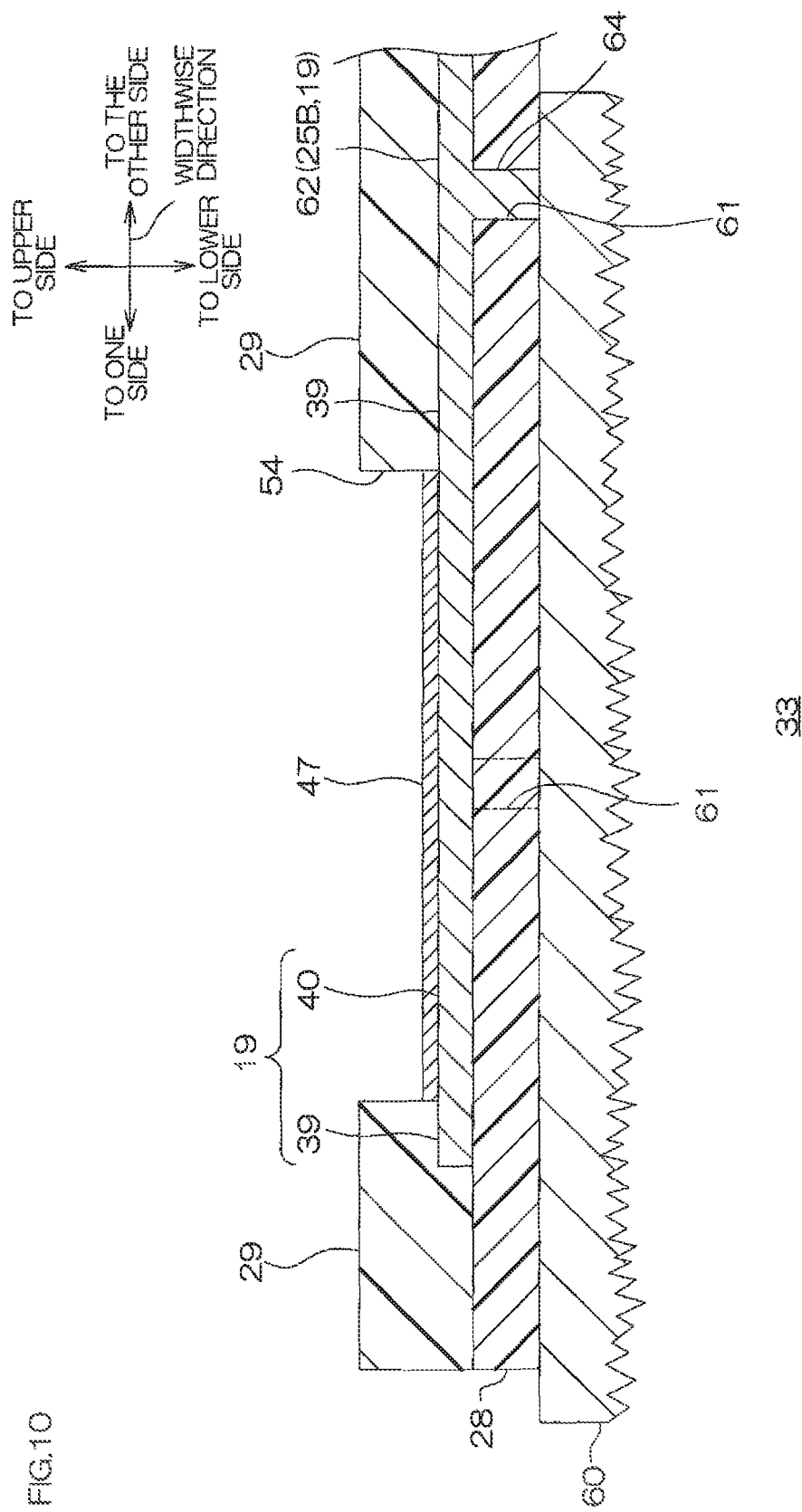
FIG. 10 shows an enlarged cross-sectional view of the pad portion (a form in which asperities are formed in the entire lower surface of each of piezoelectric-element-side terminal portions) of an assembly including a suspension board with circuit as still another embodiment of the wired circuit board of the present invention.

As shown in the embodiment of FIG. 10, it is also possible to form the asperities in the entire lower surfaces of the piezoelectric-element-side terminal portions 60. The embodiment of FIG. 10 can be produced by, e.g., covering the metal supporting layer 67 with an etching resist so as to expose the entire lower surfaces of the portions of the metal supporting layer 67 to be formed with the piezoelectric-element-side terminal portions 60 (see FIG. 8(f)) and forming the asperities in the exposed surfaces with reference to the production process view of FIG. 7(d).

Preferably, in the same manner as in the embodiment of FIG. 4, the asperities are formed in the terminal recessed portions 34. As a result, the lower surfaces of the piezoelectric-element-side terminal portions 60 are formed with the peripheral edge portions 36 in flat shapes. Accordingly, when the piezoelectric-element-side terminal portions 60 are placed with the overlapping regions 35 and the peripheral regions 80 facing downward, the peripheral edge portions 36 come in contact with a surface on which the piezoelectric-element-side terminal portions 60 are placed, while the overlapping regions 35 and the peripheral regions 80 each formed with the asperities do not come in contact with the surface on which the piezoelectric-element-side terminal portions 60 are placed to be spaced apart therefrom in the thickness direction. Therefore, it is possible to protect the asperities.

As also shown by the phantom line of FIG. 10, the conduction openings 61 can also be formed in the regions of the insulating baser layer 28 which overlap the probing terminal portions 40 and the terminal recessed portions 34 when projected in the thickness direction.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A wired circuit board, comprising:
an insulating layer formed with an opening extending therethrough in a thickness direction of the wired circuit board;
a conductive layer formed on one surface of the insulating layer in the thickness direction and including a one-side terminal portion;
an other-side terminal portion formed on an opposite surface of the insulating layer in the thickness direction, disposed so as to overlap the opening and the one-side terminal portion when projected in the thickness direction, and used to be connected to an electronic element via a conductive adhesive; and
a conductive portion filling the opening to provide electrical conduction between the one-side terminal portion and the other-side terminal portion, wherein the opening is disposed on an outside of the one-side terminal portion so as to be spaced apart therefrom, and wherein the other-side terminal portion is continuously and integrally formed so as to overlap both the opening and the one-side terminal portion when projected in the thickness direction.

2. A wired circuit board according to claim 1, wherein the other-side terminal portion has asperities formed in an opposite surface in the thickness direction, and wherein a surface roughness Ra (JIS B 0601:2001) of the opposite surface of the other-side terminal portion formed with the asperities is in a range of 0.05 µm to 5 µm.

3. A wired circuit board according to claim 2, wherein the asperities are formed at least in a region of the other-side terminal portion which overlaps the one-side terminal portion when projected in the thickness direction.

4. A wired circuit board according to claim 1, further comprising: a plating layer formed on an opposite surface of the other-side terminal portion in the thickness direction.

5. A wired circuit board according to claim 1, wherein the electronic element is a piezoelectric element.

6. A method of producing a wired circuit board, comprising:
preparing a metal supporting layer;
forming an insulating layer on one surface of the metal supporting layer in a thickness direction of the wired circuit board so as to form an opening in the insulating layer extending through the insulating layer in the thickness direction;
forming a conductive layer including a one-side terminal portion on one surface of the insulating layer in the thickness direction, while forming a conductive portion on an exposed surface of the metal supporting layer exposed from the opening; and
etching the metal supporting layer to form an other-side terminal portion provided so as to overlap at least the one-side terminal portion and the conductive portion when projected in the thickness direction, electrically conducting with the one-side terminal portion via the conductive portion, and used to be connected to an electronic element via a conductive adhesive, wherein the opening is disposed on an outside of the one-side terminal portion so as to be spaced apart therefrom, and wherein the other-side terminal portion is continuously and integrally formed so as to overlap both the opening and the one-side terminal portion when projected in the thickness direction.

7. A method of producing a wired circuit board according to claim 6, further comprising: forming asperities in an opposite surface of a region of the metal supporting layer in the thickness direction which overlaps the one-side terminal portion when projected in the thickness direction, wherein a surface roughness Ra (JIS B 0601: 2001) of an opposite surface of the other-side terminal portion formed with the asperities is in a range of 0.05 µm to 5 µm.

8. A method of producing a wired circuit board according to claim 6, further comprising: forming a plating layer on an opposite surface of the other-side terminal portion in the thickness direction.

9. A wired circuit board according to claim 1, wherein the other-side terminal portion continuously and integrally includes:
a peripheral edge portion disposed so as to overlap the opening when projected in the thickness direction and to be connected to the conductive portion; and
a terminal recessed portion disposed so as to include the one-side terminal portion when projected in the thickness direction, surrounded by the peripheral edge portion and recessed toward one side of the thickness direction from the peripheral edge portion.

* * * * *